United States Patent
Mitamura et al.

[11] Patent Number: 5,887,015
[45] Date of Patent: Mar. 23, 1999

[54] HEATER MECHANISM FOR CRYSTAL PULLING APPARATUS

[75] Inventors: Nobuaki Mitamura, Takefu; Toshiharu Uesugi, Sabae, both of Japan; Atsushi Iwasaki, Vancouver, Wash.; Shinobu Takeyasu, Urawa, Japan

[73] Assignee: Shin-Etsu Handotai Co., Ltd., Tokyo, Japan

[21] Appl. No.: 763,883

[22] Filed: Dec. 11, 1996

[30]       Foreign Application Priority Data

Dec. 27, 1995  [JP]  Japan ................................. 7-351276

[51] Int. Cl.⁶ ................................................. C03B 5/027
[52] U.S. Cl. ............................. 373/38; 373/36; 422/429; 219/420; 117/30
[58] Field of Search .................... 373/33, 36–38, 373/90–94, 100, 106, 6; 219/383, 385, 388, 420, 421, 422, 423, 424, 426; 427/247; 422/429; 117/30

[56]               References Cited

U.S. PATENT DOCUMENTS

| | | | |
|---|---|---|---|
| 1,542,716 | 6/1925 | Payne | 373/38 |
| 4,090,054 | 5/1978 | Heine et al. | 219/426 |
| 4,304,986 | 12/1981 | Olson | 219/523 |
| 4,606,037 | 8/1986 | Terashima et al. | 373/6 |
| 5,180,562 | 1/1993 | Drechsel et al. | 422/429 |
| 5,277,934 | 1/1994 | Gilbert et al. | 427/249 |
| 5,363,796 | 11/1994 | Kobayashi et al. | 117/30 |

FOREIGN PATENT DOCUMENTS

| | | |
|---|---|---|
| A-0310739 | 4/1989 | European Pat. Off. . |
| A-3506754 | 8/1986 | Germany . |
| A-3-37109 | 2/1991 | Japan . |

OTHER PUBLICATIONS

W. Zulehner, "Czochralski Growth of Silicon", Seventh International Conference on Crystal Growth (ICCG–7), *Journal of Crystal Growth*, Dec. 1983, pp. 189–213.

*Primary Examiner*—Tu Ba Hoang
*Attorney, Agent, or Firm*—Oliff & Berridge, PLC

[57]               ABSTRACT

A heater mechanism for a crystal pulling apparatus is disclosed. Electrodes made of copper or the like and disposed under a heater are connected to the heater via graphite members. A cover member is attached to each graphite member, so that the downwardly extending portion of the cover member surrounds the outer surface of the graphite member. Accordingly, a leak or splash of a melt is prevented from contacting the electrodes. The length of each graphite member is equal to or greater than the distance between the bottom surface of the heater and the top surface of a melt spill tray which distance is measured when the heater mechanism is raised The cover member is vertically slidable along the outer surface of each graphite member. Thus, even when a material melt leaks out from a crucible, the electrodes of the heater mechanism can be protected from a fusion damage or the like which would be otherwise caused by the leak of the melt.

8 Claims, 3 Drawing Sheets

HEATER MECHANISM FOR CRYSTAL PULLING APPARATUS

BACKGROUND OF THE INVENTION

1. Field of the Invention

The present invention relates to an improved technique related to a heater mechanism for maintaining at a predetermined temperature a material melt within a crucible of a crystal pulling apparatus.

2. Description of the Related Art

Conventionally, there has been known a crystal pulling apparatus wherein a seed crystal is brought into contact with, for example, a melt of silicon (semiconductor material) and is subsequently pulled while the seed crystal is gradually rotated, to thereby grow a single crystal. In such a crystal pulling apparatus, a heater mechanism is disposed around a crucible in which a silicon melt is contained, so as to maintain the silicon melt at a predetermined temperature. Among such heater mechanisms, there has been known a heater mechanism which can be moved vertically so as to vary the temperature of a melt when, for example, it is necessary to control the diameter of a crystal.

FIG. 5 shows an example of such a vertically movable heater. In FIG. 5, a heater mechanism 51 includes a cylindrical graphite heater 52 which surrounds an unillustrated crucible, and an electrode 53 made of copper or the like and connected to the lower portion of the graphite heater 52. The electrode 53 is passed through an electrode insertion hole h formed in a melt spill tray 54, which is disposed under the crucible, so that the heater mechanism 51 can move vertically. However, since the electrode 53 is projected upward from the melt spill tray 54 into a furnace as shown in FIG. 5, the vertically movable heater suffers the following significant drawbacks. For example, if a melt should leak from a crucible due to damage to the crucible, the leaking melt would flow along the heater 52 and reach the electrode 53, or splash onto the electrode 53. In such a case, the electrode 53 made of copper or the like would melt within a short period of time. This may cause a leak of the internal cooling water, resulting in the risk of a serious accident such as a steam explosion. Therefore, it has been desired to solve the above-described drawbacks.

SUMMARY OF THE INVENTION

The present invention has been accomplished to solve the above-mentioned problems, and it is an object of the invention to provide a heater mechanism for a crystal pulling apparatus, which heater mechanism can prevent a leaking melt, if any, from contacting electrodes and prevent the electrodes from being melted and thereby damaged within a short period of time even when the leaking melt flows down along a heater.

The present invention provides a heater mechanism for a crystal pulling apparatus, wherein a graphite member is used for at least a part of an upper portion of an electrode which is projected into a furnace when a heater is raised.

Graphite has a melting point of 3550° C., which is the highest among elements and indicates that graphite has far better heat resistance as compared with copper, whose melting point is about 1083° C. Thus, for example, even when the melt flows down along the heater and reaches the graphite member, the graphite member will not be melted within a short period of time. Thus, safety is improved.

The temperature of a silicon melt is about 1400° C., but most materials are said to be melted when they are in contact with the silicon melt for a long period of time. Further, the silicon melt has a very low viscosity and thus behaves nearly like water.

Preferably, the graphite member is removably attached to the upper portion of the electrode by screw engagement.

This screw engagement allows easy replacement of the graphite member when it is worn or damaged.

Preferably, a cover member is attached to the graphite member such that the downwardly extending portion of the cover member covers an outer circumferential surface of the graphite member projected into the furnace. The cover member is preferably made of a heat resistant material such as graphite or ceramics. The cover member may have any shape such as an umbrella-like shape or an inverted-cup shape, insofar as it can prevent a leaking melt from entering an electrode insertion hole.

Since the outer circumferential surface of the graphite member is covered as described above, a leaking melt, if any, is prevented from entering an electrode insertion hole and consequently contacting a copper electrode and other members.

Preferably, the cover member is vertically movable along the outer circumferential surface of the graphite member in accordance with a vertical movement of the heater.

In the case where the heater mechanism is required to have a relatively large vertical stroke, it is preferred to increase the length of the downwardly extending portion of the cover so as to completely cover the graphite member. However, when the downwardly extending portion of the cover member is too long, the required vertical stroke cannot be obtained due to interference between the bottom end of the downwardly extending portion and a melt spill tray or the like. On the other hand, when the downwardly extending portion of the cover member is too short, a part of the graphite member is exposed within the furnace, resulting in potential entry of the melt into the electrode insertion hole. In order to solve the problem, the present invention provides a heater mechanism in which the cover member is made vertically movable along the outer circumferential surface of the graphite member to thereby secure a required vertical stroke of the heater mechanism and to completely surround the graphite member, particularly the connection portion between the graphite member and the electrode.

BRIEF DESCRIPTION OF THE DRAWINGS

FIGS. 3A and 3B are views for illustrating a problem involved in the case of a heater mechanism having a large vertical stroke, wherein FIG. 3A is a view for illustrating the state that the heater mechanism is lowered and FIG. 3B is a view for illustrating the state that the heater mechanism is raised;

FIGS. 4A and 4B are views for illustrating the operation of an improved heater mechanism in which a cover member is vertically movable, wherein FIG. 4A is a view for illustrating the state that the heater mechanism is raised and FIG. 4B is a view for illustrating the state that the heater mechanism is lowered.

DESCRIPTION OF THE PREFERRED EMBODIMENT

An embodiment of the present invention will now be described in detail with reference to the drawings.

Figure 1:
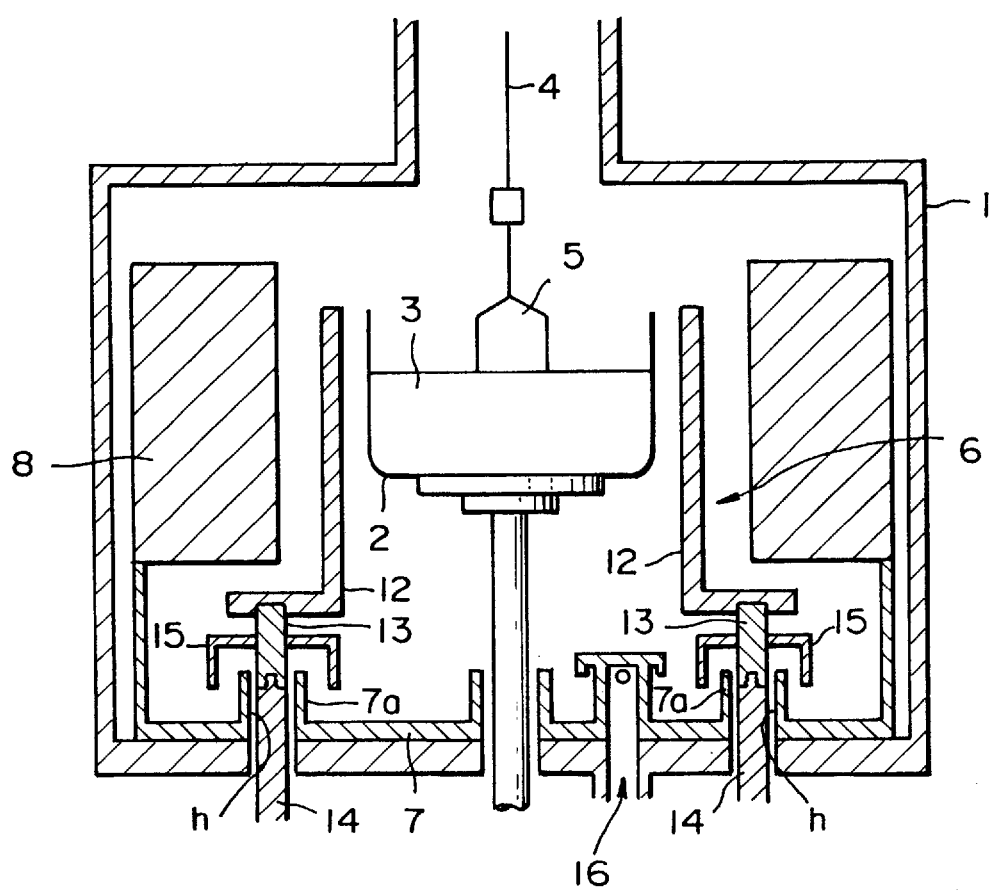
FIG. 1 is a sectional view showing a heater mechanism incorporated in a crystal pulling apparatus.

Referring to FIG. 1 which shows a crystal pulling apparatus, a material melt 3 is contained in a quartz crucible 2 installed within a chamber (furnace) 1. A seed crystal suspended by a cable 4 is caused to lightly touch the surface of the material melt 3 within the quartz crucible 2, and is subsequently pulled upwardly while being rotated gradually, to thereby grow a crystal 5. A heater mechanism 6 is disposed around the crucible 2 so as to heat the melt 3 to a predetermined temperature and to maintain the melt 3 at the temperature. The heater mechanism 6 is vertically movable by an unillustrated lifting mechanism through an electrode insertion hole h which is formed in a melt spill tray 7 made of graphite, ceramics, or a like material and disposed under the crucible 2. A heat insulating cylinder 8 made of graphite is disposed around the heater mechanism 6 to thereby provide a shield against internal heat.

An evacuation section 16 is provided in the vicinity of the central portion of the melt spill tray 7 in order to evacuate the chamber 1.

There is known a crystal pulling apparatus having the above-described structure which employs the CCZ method (Continuous Czochralski method), in which the crystal 5 is grown while granular polycrystalline material is continuously fed from outside the chamber 1 into the material melt 3 contained in the crucible 2. In this crystal pulling apparatus, an unillustrated material feed pipe made of quartz glass or the like is inserted through an unillustrated material feed port formed in the chamber 1 so as to extend to a space above the crucible 2. Thus, granular polycrystalline material is fed from a material tank located outside the chamber 1 through the material feed pipe and is then charged into the material melt 3.

The heater mechanism 6 of the present invention functions effectively particularly in the case where the melt 3 is likely to leak out from the crucible 2 due to a long operation period as in a crystal pulling apparatus which employs the CCZ method.

Figure 2:
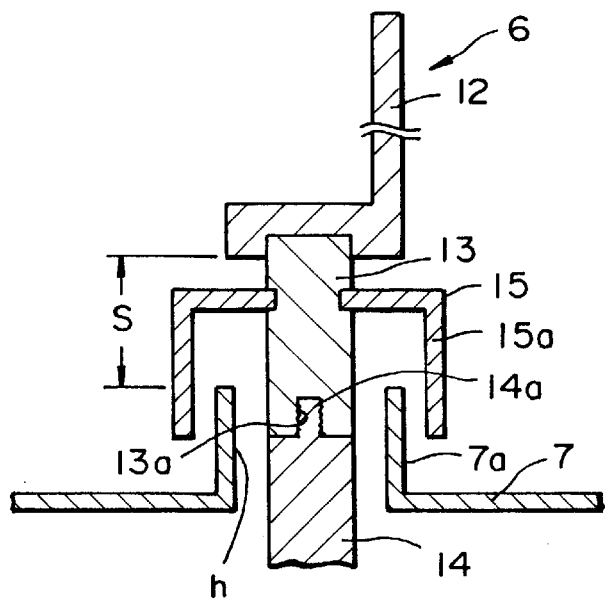
FIG. 2 is a view showing part of a heater mechanism according to the present invention.

As also shown in FIG. 2, the heater mechanism 6 of the present invention includes a cylindrical graphite heater 12 which surrounds the crucible 2, two copper electrodes 14 which are disposed under the heater 12 and are connected to the heater 12 at two locations via corresponding two graphite members 13, and an inverted-cup-shaped cover member 15 attached to each graphite member 13. The cover member 15 is also made of graphite, and a cylindrical downwardly extending portion 15a (FIG. 2) thereof surrounds the outer circumferential surface of the graphite member 13.

As shown in FIG. 2, the graphite member 13 is longer than the distance s between the top end surface of the electrode insertion hole h and the bottom end surface of the heater 12, which distance is measured when the heater mechanism 6 is raised. An externally threaded portion 14a formed at the top end portion of the electrode 14 is screw-engaged with an internally threaded portion 13a formed in the bottom end portion of the graphite member 13.

The portion of the melt spill tray 7 which surrounds each electrode insertion hole h is bent upward to form a flange portion 7a, which prevents a leak of the melt 3, if any, from leaking out through the electrode insertion hole h.

When the heater mechanism 6 having the above-described structure is raised by the unillustrated lifting mechanism, the graphite member 13 is located within the chamber (furnace) 1 while the electrode 14 remains outside the chamber (furnace) 1. Thus, even when the melt 3 leaks out from the crucible 2, the leak of the melt 3 will not contact the electrode 14.

Moreover, since the outer circumferential surface of the graphite member 13 is surrounding by the downwardly extending portion 15a of the cover member 15, the electrode 14 is fully protected against a leak of the melt 3.

Through the above-described protection of the electrode 14 from a fusion damage, safety is further improved.

Figures 3A, 3B:
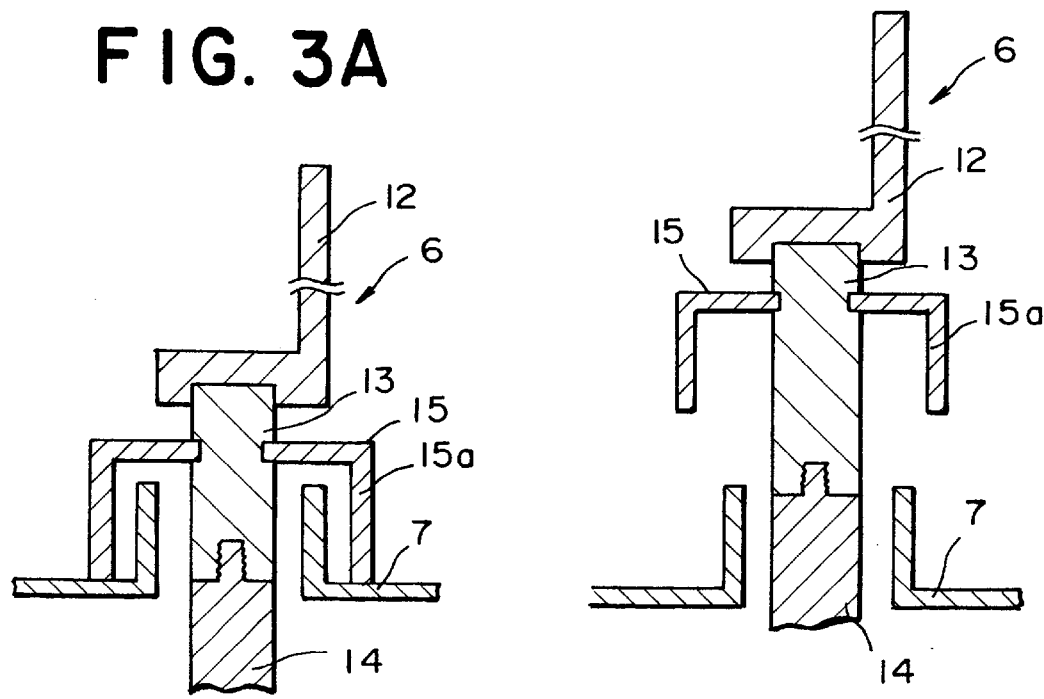

In the above-described embodiment, when the cover member 15 is fixed onto the graphite member 13, a problem as illustrated in FIGS. 3A and 3B may arise. That is, when the vertical stroke of the heater mechanism 6 is increased, it is preferred to increase the length of the downwardly extending portion 15a of the cover member 15 so as to completely cover the graphite member 13. However, when the downwardly extending portion 15a is made too long, the downward stroke of the heater mechanism 6 is limited, because the bottom end surface of the downwardly extending portion 15a abuts the top surface of the melt spill tray 7, as shown in FIG. 3A. On the other hand, when the downwardly extending portion 15a is made shorter, the downward stroke can be increased, but part of the outer circumferential surface of the graphite member 13 is exposed within the chamber 1. This involves the risk that the graphite member 13 is splashed with the melt 3 and that the thus-adhering melt 3 flows down to the electrode 14.

Figure 4A:
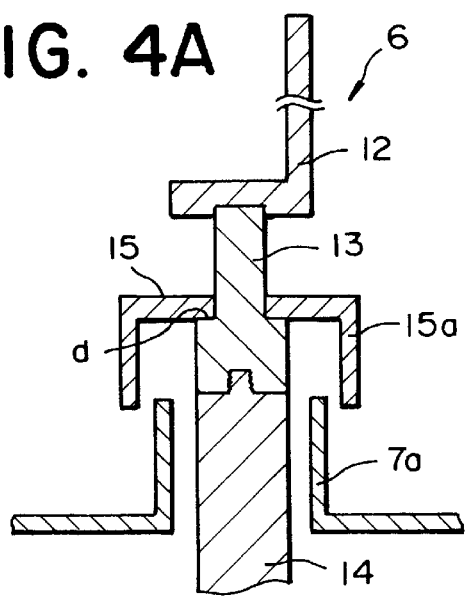
Figure 4B:
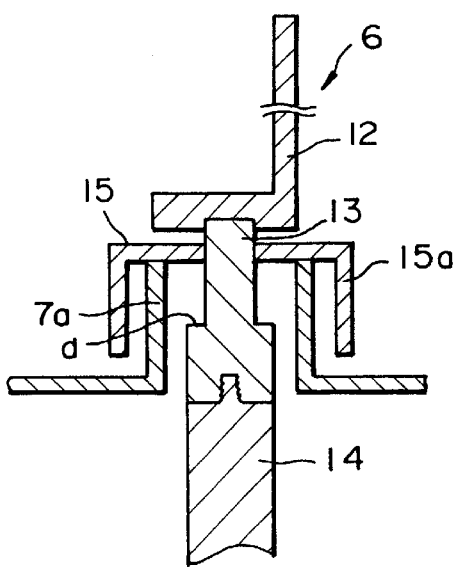
Figure 5:
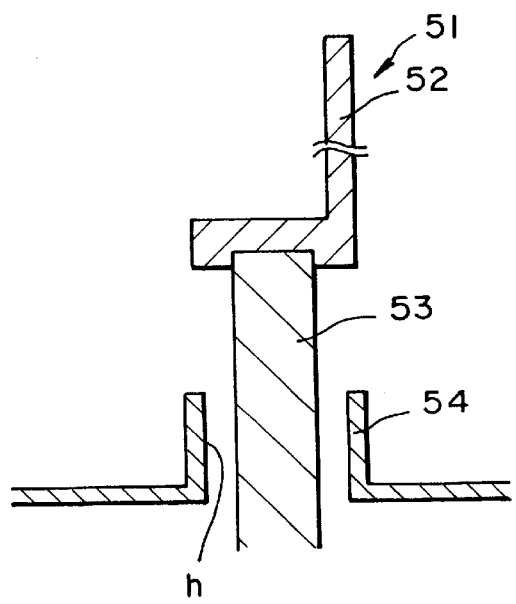
FIG. 5 is a view showing a conventional heater mechanism.

FIGS. 4A and 4B show an improved structure to cope with the above-mentioned problem.

That is, a stepped portion d is formed on the graphite member 13 such that the portion of the graphite member 13 above the stepped portion d has a smaller diameter while the portion of the graphite member 13 below the stepped portion d has a larger diameter. The cover member 15 is attached to the upper small-diameter portion such that it is vertically slidable along the small-diameter portion.

Thus, as shown in FIG. 4A, when the heater mechanism 6 is raised, the cover member 15 lowers to the stepped portion d by its own weight, so that the graphite member 13, including the connection portion between the graphite member 13 and the electrode 14, is surrounding by the cover member 15. On the other hand, as shown in FIG. 4B, when the heater 6 is lowered, the cover member 15 abuts the top end surface of the flange portion 7a and is thus pushed up to thereby provide the heater mechanism 6 with a sufficiently large stroke for downward movement.

The above-described structure allows the heater mechanism 6 to have a relatively large vertical stroke and enables the connection portion between the graphite member 13 and the electrode 14 to be completely surrounded by the cover member 15, thereby preventing a leak or splash of the melt 3, if any, from contacting the electrode 14 which would otherwise cause a fusion damage to the electrode 14.

What is claimed is:

1. A heater mechanism for a crystal pulling apparatus, comprising:
   a heater which is vertically moved in a furnace;
   an electrode connected to said heater through an upper end thereof; and
   a graphite member which forms at least a part of an upper portion of said electrode, said part being projected into said furnace when said heater is raised.

2. A heater mechanism for a crystal pulling apparatus according to claim 1, wherein said graphite member is removably attached to the upper portion of said electrode by screw engagement.

3. A heater mechanism for a crystal pulling apparatus according to claim 1, wherein a cover member is attached to said graphite member such that a downwardly extending portion of said cover member covers an outer circumferential surface of said graphite member which projects into said furnace.

4. A heater mechanism for a crystal pulling apparatus according to claim 3, wherein said cover member is made of a heat resistant material selected from the group consisting of graphite and ceramics.

5. A heater mechanism for a crystal pulling apparatus according to claim 3, wherein said cover member is disposed such that it is vertically movable along the outer circumferential surface of said graphite member and is moved in a predetermined direction in accordance with a vertical movement of said heater.

6. A heater mechanism for a crystal pulling apparatus according to claim 2, wherein a cover member is attached to said graphite member such that a downwardly extending portion of said cover member covers an outer circumferential surface of said graphite member which projects into said furnace.

7. A heater mechanism for a crystal pulling apparatus according to claim 6, wherein said cover member is made of a heat resistant material selected from the group consisting of graphite and ceramics.

8. A heater mechanism for a crystal pulling apparatus according to claim 6, wherein said cover member is disposed such that it is vertically movable along the outer circumferential surface of said graphite member and is moved in a predetermined direction in accordance with a vertical movement of said heater.

* * * * *